United States Patent
Lin et al.

(10) Patent No.: US 6,620,683 B1
(45) Date of Patent: Sep. 16, 2003

(54) TWIN-BIT MEMORY CELL HAVING SHARED WORD LINES AND SHARED BIT-LINE CONTACTS FOR ELECTRICALLY ERASABLE AND PROGRAMMABLE READ-ONLY MEMORY (EEPROM) AND METHOD OF MANUFACTURING THE SAME

(75) Inventors: Boson Lin, Hsin-Chu (TW); Ching-Wen Cho, Nan-Tow (TW); David Ho, Taichuang (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/003,841

(22) Filed: Dec. 4, 2001

(51) Int. Cl.7 .............................................. H01L 21/336
(52) U.S. Cl. ...................... 438/257; 438/300; 438/261; 438/262; 257/291; 257/301; 257/309; 257/314
(58) Field of Search .................. 438/257–262, 438/266, 267, 588–594; 365/185.05, 185.14; 257/301, 309, 311, 291

(56) References Cited

U.S. PATENT DOCUMENTS

| 5,494,838 A | 2/1996 | Chang et al. | |
| 5,714,412 A | 2/1998 | Liang et al. | 438/266 |
| 5,812,449 A | 9/1998 | Song | 365/185.03 |
| 6,008,085 A | * 12/1999 | Sung et al. | 438/253 |
| 6,103,573 A | 8/2000 | Harari et al. | 438/257 |
| 6,151,248 A | 11/2000 | Harari et al. | 365/185.14 |
| 6,385,089 B2 | * 5/2002 | Sung et al. | 365/185.18 |

* cited by examiner

Primary Examiner—Dung Anh Le
(74) Attorney, Agent, or Firm—George O. Saile; Stephen B. Ackerman

(57) ABSTRACT

A semiconductor EEPROM device and a method for making it are achieved. The EEPROM device is a novel twin-bit cell structure with adjacent floating gates having a common control gate and common bit-line contact in each cell area. In each cell area a first and second floating gate is formed. Source areas are formed in the substrate adjacent to the outer edges of the floating gates and a drain area is formed between and adjacent to the floating gates. A gate oxide is formed over the floating gates. A control gate is formed over the drain area and patterned to also partially extend over the floating gates. The control gate is also patterned to provide a recess for a bit-line contact to the drain area. The recess results in reduced cell area and the non-critical overlay of the control gate over the floating gates results in relaxed overlay alignment.

25 Claims, 2 Drawing Sheets

TWIN-BIT MEMORY CELL HAVING SHARED WORD LINES AND SHARED BIT-LINE CONTACTS FOR ELECTRICALLY ERASABLE AND PROGRAMMABLE READ-ONLY MEMORY (EEPROM) AND METHOD OF MANUFACTURING THE SAME

BACKGROUND OF THE INVENTION (1) Field of the Invention

The present invention relates to an electrically erasable programmable read-only memory (EEPROM), and more particularly to a novel twin-bit EEPROM structure and a method of fabrication. Adjacent floating gates in an array of EEPROM cells share a common control gate and a common bit-line contact. This novel structure results in an EEPROM with reduced cell size, higher erase speeds, and non-critical alignment of the control gate over the floating gates. More specifically, the channel length of the control gate is independent on the overlap between the control gate and the floating gates.

(2) Description of the Prior Art

A typical prior-art EEPROM-type device consists in part of an array of memory cells. Each cell is composed of a single field effect transistor (FET) having a floating gate and a control gate. The floating gate and control gate are typically formed by patterning two conductively doped polysilicon layers, and the floating gate, as its name implies, is completely surrounded by an electrically isolating dielectric. In the array of cells the floating gates are formed over a thin oxide grown on the device areas of the FETs. A portion of this oxide serves as a tunnel oxide in which hot electrons are injected from each FET source area to charge the floating gate electrode. A thin interlevel dielectric insulating layer is formed on the floating gates. The control gates are formed on the dielectric insulating layer over the floating gates, and extend over the FET channel areas adjacent to the floating gates and drain areas. Each control gate is accessed by the peripheral circuits on the EEPROM chip via word lines that interconnect the FET control gates. The control gates and floating gates are capacitively coupled through the thin dielectric layer. Selected cells are then coded (programmed) by applying a sufficiently high voltage potential between the control gate and the FET source, resulting in the injection of hot channel electrons in the substrate through the thin tunnel oxide into the floating gate. Since the floating gate is well insulated, the accumulated charge is retained for an indefinite period of time thereby providing for an array of coded non-volatile memory (NVM) cells. The charge stored on the floating gate shifts the threshold voltage ($V_t$) on the programmed (charged) FET, while the $V_t$ on the non-programmed (uncharged) FET is not shifted in value. For example, if the floating gate is formed on an N-channel FET, the $V_t$ on the programmed FET (negatively charged gate) is shifted to a higher positive voltage. When the memory cell on the EEPROM chip is selected by the addressed decode circuit on the periphery of the EEPROM chip, and a gate voltage ($V_g$) is applied to the control gate having a value between the $V_t$ of the non-programmed and programmed FETs, the non-programmed FET turns on and the programmed FET does not. The conductive state (on or off) of the FET channel is then interpreted as digital binary ones or zeros. Typically these EEPROM cells are erased by applying a high voltage (about 12 to 14 volts) to the control gates while grounding the source lines to charge or discharge the floating gates by way of Fowler Nordheim tunneling.

Typical EEPROM voltages applied to the source line (SL), control gate (CG) and bit line (BL) (drain) for the program cycle are shown in row 1 of TABLE I. The EEPROM is read by selecting the desired cells (floating gates) and applying the voltages shown in row 2 of TABLE I, and sensing the currents or voltages on the bit line. Finally the programmed EEPROM can be erased by applying the voltages shown in row 3 and relying upon the Fowler Nordheim tunneling to charge or discharge the floating gate.

TABLE I

| | | SL | FG | CG | BL |
|---|---|---|---|---|---|
| 1. | PGM FG | 12–14V | 0 or 1 | 2–3V | GRND |
| 2. | READ FG | 2–3V | 0 or 1 | 2–3V | SENSE |
| 3. | ERASE FG | GRND | 0 or 1 | 14V | GRND |

One method of making these EEPROMs is described in U.S. Pat. No. 5,714,412 to Liang et al. A split-floating gate is formed between the FET source and drain and a control gate is formed between the split-gates. The floating gate in each cell can be individually programmed to provide for multilevel storage. Another method is described in U.S. Pat. No. 6,151,248 to Harari et al. In this method the control gate or select gate is shared by adjacent floating gates having right and left steering gates. A second version of Harari's EEPROM using a dual floating gate EEPROM cell array is described U.S. Pat. No. 6,103,573. In U.S. Pat. No. 5,812,449 to Song, an EEPROM is described in which two floating gates are formed between the source area and drain area to provide a 4-numeration information device. And in U.S. Pat. No. 5,494,838 to Chang et al. an EEPROM memory device is described using sidewall spacer floating gates.

However, there is still a need in the semiconductor industry to make EEPROM devices having increased cell density, relaxed alignment tolerance, and a simpler and more cost-effective process.

SUMMARY OF THE INVENTION

A principal object of this invention is to provide an EEPROM cell structure having increased cell density.

Another object of this invention is to form these EEPROM cells having a common control gate between adjacent floating gates and having a common bit-line contact.

A further object of this invention is to provide a process and structure with relaxed overlay alignment between the floating gate and the control gate.

In accordance with the objectives of this invention, a method is provided for fabricating a novel electrically erasable and programmable read only memory (EEPROM) device. Each memory cell in the EEPROM utilizes a common control gate between a first and a second floating gate, and utilizes a common bit line to form a more compact cell area with higher erase speeds. The method also provides a process that relaxes the overlay alignment tolerance between the control gate and the under lying floating gates.

In summary, the method for making this array of novel EEPROM cells begins by providing a semiconductor substrate, preferably a P⁻ doped single-crystal silicon having a <100> crystallographic orientation, and having an array of device areas. Continuing with the process, a tunnel oxide layer is formed on the substrate, for example by thermal oxidation. A first polysilicon layer is deposited by LPCVD and is doped with an N-type dopant, such as As or P. Conventional photo-lithographic techniques and anisotropic etching are used to pattern the first polysilicon layer to form a first and second floating gate in each device area of the array of device areas. Next, source areas are formed in the substrate adjacent to the outer edges of the pair of floating gates and a drain area is formed adjacent to and between the first and second floating gates. For example, the source and drain areas can be formed at the same time by ion implanting an N type dopant, such as arsenic. A conformal gate oxide layer is formed over the floating gates by a second thermal oxidation. A conformal second poly-silicon layer is deposited and doped with and N type dopant, such as phosphorus. The second polysilicon layer is patterned to form a control gate. A key feature of this invention is to provide a control gate over the drain area that also extends partially over the adjacent first and second floating gates. This partial overlay provides greater latitude in aligning the control gate over the floating gates. This invention also provides a novel structure by patterning the control gate to expose underlying portions of the drain area for a common bit-line contact in each cell area, which results in increased cell density. An interlevel dielectric (ILD) layer is deposited on the substrate to electrically insulate the floating gates and control gates from the next level of interconnections. The ILD layer is preferably a doped silicon oxide ($SiO_x$) deposited by chemical vapor deposition (CVD). Contact openings are etched in the ILD layer, which include a contact opening to each drain area for a bit-line contact in each of the device areas in the array of device areas. The EEPROM is then completed using conventional processing to form the bit-line contacts in the bit-line-contact openings and the additional levels of interconnections.

BRIEF DESCRIPTION OF THE DRAWINGS

The object and other advantages of this invention are best explained and will become more apparent in the preferred embodiment with reference to the accompanying drawings.

DESCRIPTION OF THE PREFERRED EMBODIMENT

This invention is now described in detail for making an array of non-volatile memory cells, and more specifically for EEPROM circuits. The method involves forming non-volatile memory cells in which a first and a second floating gate share a common control gate and a common bit-line contact.

Figure 1:
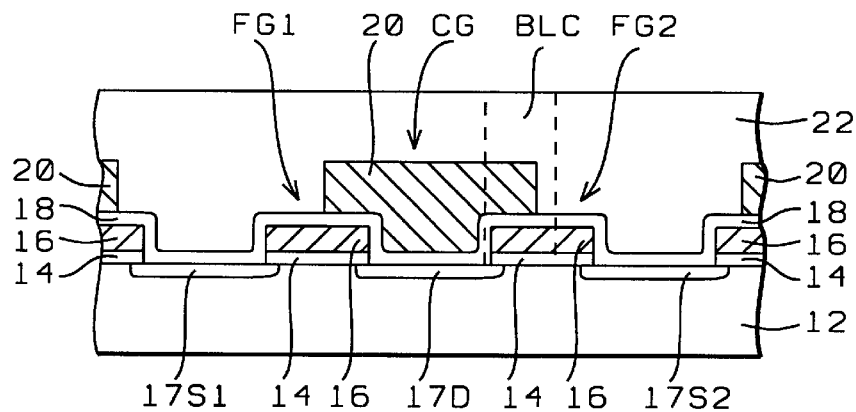
FIG. 1 is a schematic cross-sectional view of an EEPROM cell of an array of EEPROM cells of this invention, and has a first and second floating gate and a common control gate and a common bit line.

Referring to FIG. 1, the method for making this array of novel EEPROM cells begins by providing a semiconductor substrate 12 having an array of device areas. The substrate is preferably a P⁻ doped single-crystal silicon having a <100> crystallographic orientation. One device area of the array of device areas is depicted in FIG. 1. The method of making the EEPROM cells continues by forming a tunnel oxide layer 14 on the substrate 12. The tunnel oxide 14 is formed by thermal oxidation to form $SiO_2$, and is grown to a thickness of between about 40 and 250 Angstroms. A first polysilicon layer 16 is deposited by LPCVD using, for example, silane ($SiH_4$) as the reactant gas. The first poly-silicon layer 16 is deposited to a preferred thickness of between about 300 and 3000 Angstroms. Polysilicon layer 16 is doped, preferably with an N-type dopant, such as arsenic (As) or phosphorus (P), using either ion implantation or alternatively in-situ doped during deposition. Layer 16 is doped to a preferred concentration of between about $1.0 \text{ E } 19$ and $1.0 \text{ E } 21$ atoms/cm³. Using conventional photolithographic techniques and anisotropic plasma etching the first polysilicon layer 16 is patterned to form a first floating gate FG1 and a second floating gate FG2 in each device area of the array of device areas. For example, the plasma etching can be carried out using a high-density plasma (HDP) etcher and an etchant gas containing chlorine (Cl).

Continuing with FIG. 1, source areas 17S are formed in the substrate 12 adjacent to the outer edges of the pair of floating gates FG1 and FG2, and a drain area 17D is formed adjacent to and between the first and second floating gates. These source areas 17S consist of a buried source line SL1 adjacent to the outer edge of the first floating gate FG1 in each cell area, and a second buried source line SL2 adjacent to the outer edge of the second floating gate FG2 in each cell area, as also depicted in the top view of Fig. 2. For example, the source and drain areas can be formed separately, but preferably are formed at the same time by ion implanting an N type dopant, such as As. The source and drain areas are preferably implanted to provide a final dopant concentration of between about $1.0 \text{ E } 18$ and $1.0 \text{ E } 20$ atoms/cm³. A conformal gate oxide layer 18 is formed over the floating gates FG1 and FG2. The gate oxide layer 18 can be formed, for example, by a second thermal oxidation. Alternatively, layer 18 can he formed using a high-temperature oxide (HTO). The gate oxide layer 18 has a preferred thickness of between about 20 and 1000 Angstroms. A conformal second polysilicon layer 20 is deposited. Layer 20 is doped preferably with and N type conductive dopant, such as phosphorus, and is doped using ion implantation, or is in-situ doped during deposition to a final concentration of between about $1.0 \text{ E } 19$ and $1.0 \text{ E } 21$ atoms/cm³. Layer 20 is deposited preferably by LPCVD to a thickness of between 300 to 5000 Angstroms. The second polysilicon layer 20 is patterned to form a control gate CG over the drain area 17D, and a key feature of this invention is that the control gate CG also extends partially over the floating gates FG1 and FG2. This partial overlay provides greater latitude in aligning the control gate CG over the floating gates FG1 and FG2. Further, the width or channel length of the control gate is independent of the overlap of the control gate over the floating gates. The second polysilicon layer 20 can be etched, for example, using a HDP etcher and an etchant gas containing Cl.

Figure 2:
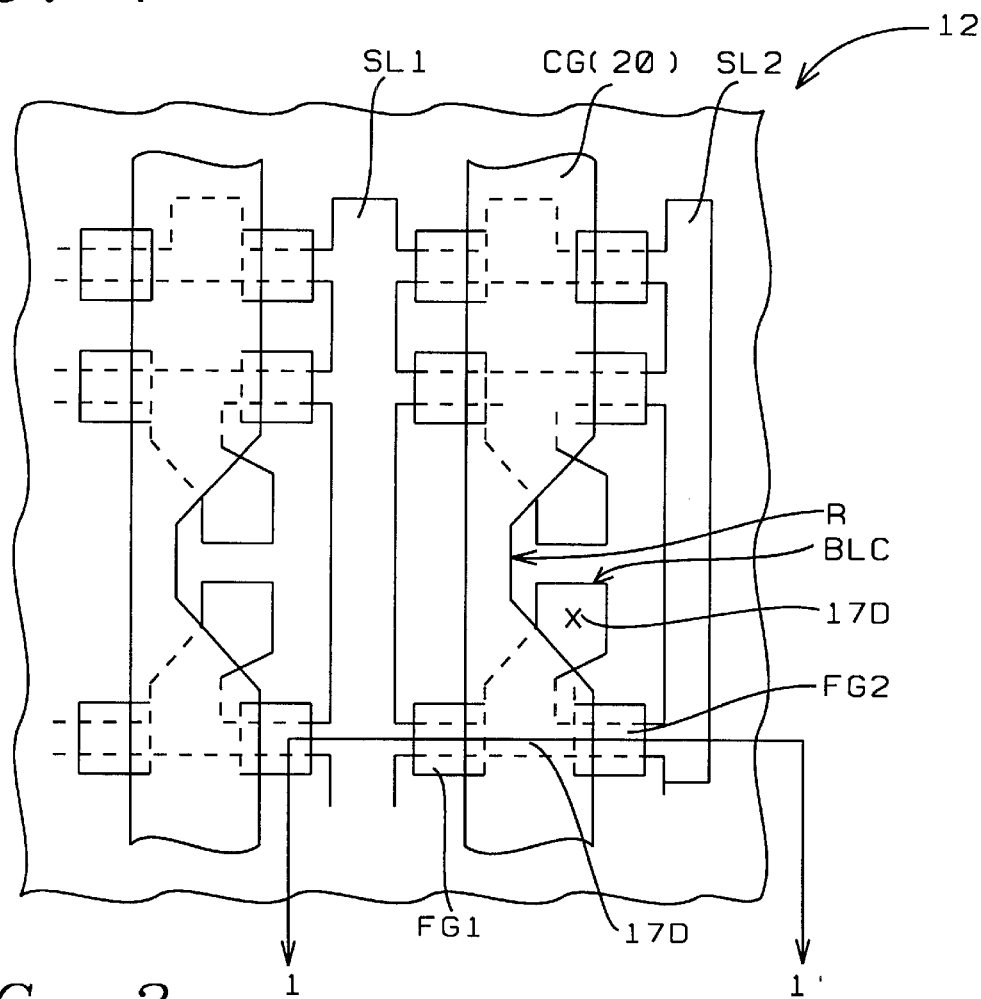
FIG. 2 is a schematic top view of this EEPROM cell showing the novel design.

Referring next to FIG. 2, a top view of showing a portion of the EEPROM heaving six twin-bit device areas is depicted. The region through 1–1' of FIG. 2 represents the cross section shown in FIG. 1. The elements of the twin-bit memory cell labeled in FIG. 1 are labeled similarly in the top view of FIG. 2. As shown in FIG. 2, the control gate CG is patterned to provide a recessed portion R over a portion of the drain area 17D for providing a common bit-line contact in each of the twin-bit cell areas. This novel structure results in increased cell density.

Referring back to FIG. 1 and continuing with the process, an interlevel dielectric (ILD) layer 22 is deposited on the substrate 12 to electrically insulate the floating gates FG1 and FG2 and the control gate CG from the next level of interconnections. The ILD layer 22 is preferably a doped silicon oxide ($SiO_x$), such as a borophosphosilicate glass (BPSG), and is deposited by chemical vapor deposition (CVD) using boron and P dopants. The ILD layer 22 is deposited to a thickness of between about 2000 and 8000 Angstroms. Contact openings are then etched in the ILD layer 22, which include a bit-line contact opening BL to each drain area for a bit-line contact in each of the device (twin-bit cell) areas in the array of device areas. Conventional processing is used to form the bit-line contacts (not shown) in the bit-line-contact openings BL, and additional levels of interconnections (not shown) are formed to complete the novel twin-bit EEPROM structure.

Figure 3:
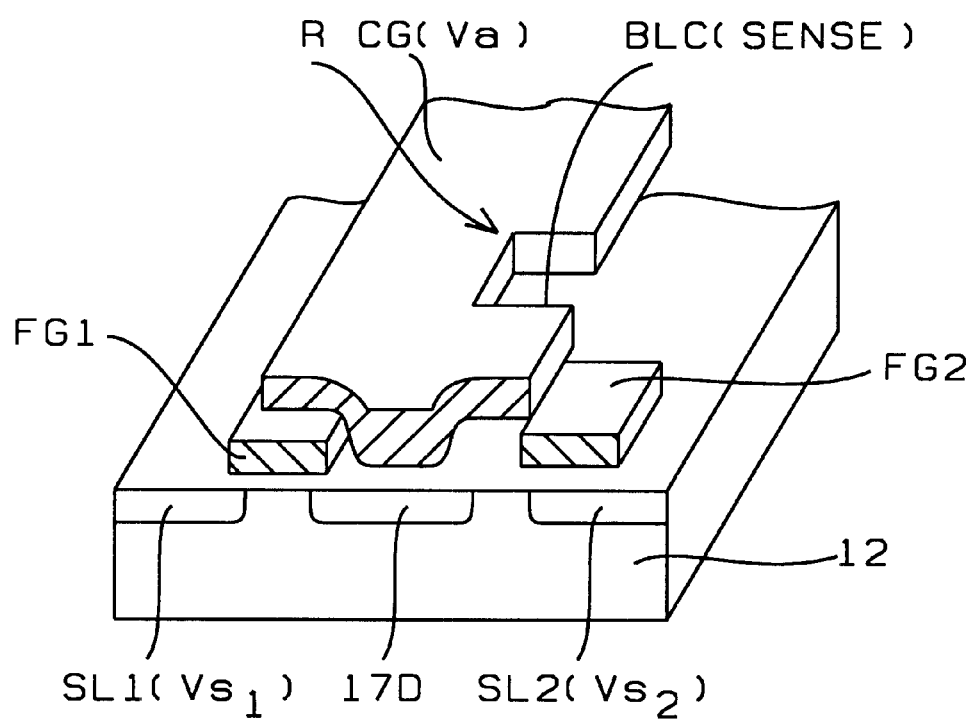
FIG. 3 shows a aerial view of the unique architecture of the cell structure of this EEPROM in accordance with this invention.

To better appreciate the operation of this novel twin-bit EEPROM, an aerial view is depicted in FIG. 3, and the sequences of voltages for erasing, programming, and reading is listed in TABLE II. To simplify the drawing the aerial view of FIG. 3 does not depict the insulating layers over the floating gates FG1 and FG2 and over the control gate CG. However, the recess R in the control gate CG for the bit-line contact BL is depicted for increasing the cell density.

In TABLE II the labels for the column headings are for source line 1 (SL1), floating gate 1 (FG1), control gate (CG), floating gate 2 (FG2), bit line (BL), and source line 2 (SL2), and represent the voltages applied for the various operation steps. Row 1 represents the applied voltages for programming FG1, and Row 2 represents the applied voltages for programming FG2. Rows 3 and 4 represent the applied voltages for reading (sensing the current or voltage on the bit line) FG1 and FG2, respectively. Rows 5 and 6 represent the applied voltages for erasing FG1 and FG2, respectively.

TABLE II

| | | | SL1 | FG1 | CG | FG2 | BL | SL2 |
|---|---|---|---|---|---|---|---|---|
| 1. | PGM | FG1 | 12–14 V | 0/1 | 2–3 V | — | GRND | GRND |
| 2. | PGM | FG2 | GRND | — | 2–3 V | 0/1 | GRND | 12–14 V |
| 3. | READ | FG1 | 2–3 V | 0/1 | 2–3 V | — | SENSE | GRND |
| 4. | READ | FG2 | GRND | — | 2–3 V | 0/1 | SENSE | 2–3 V |
| 5. | ERASE | FG1 | GRND | 0/1 | 14 V | 0/1 | GRND | GRND |
| 6. | ERASE | FG2 | GRND | 0/1 | 14 V | 0/1 | GRND | GRND |

While the invention has been particularly shown and described with reference to the preferred embodiment thereof, it will be understood by those skilled in the art that various changes in form and details may be made without departing from the spirit and scope of the invention.

What is claimed is:

1. A method of fabricating an array of non-volatile memory cells for EEPROM circuits comprising the steps of:

providing a substrate having an array of device areas;

forming a tunnel oxide layer on said array of device areas;

forming a first and second floating gate in each device area of said array of device areas;

forming source areas in said substrate adjacent to outer edge of said floating gates and forming a drain area adjacent to and between said first and second floating gates;

forming a gate oxide layer on said floating gates;

forming a control gate over said drain area, and extending over said first and second floating gates, said control gate patterned with recesses to expose underlying portions of said drain area for a bit line contact;

forming an interlevel dielectric layer on said substrate;

etching a contact opening in said interlevel dielectric layer to said drain area for said bit line contact in each said device area in said array of device areas.

2. The method of claim 1, wherein said tunnel oxide is silicon oxide and is formed by thermal oxidation.

3. The method of claim 1, wherein said tunnel oxide is formed to a thickness of about 40 to 250 Angstroms.

4. The method of claim 1, wherein said first and second floating gates are formed from a polysilicon layer deposited to a thickness of about 300 to 3000 Angstroms and doped to a concentration of between about 1.0 E 19 and 1.0 E 21 atoms/cm$^3$.

5. The method of claim 1, wherein said source areas and said drain area are formed by ion implanting a conductive dopant in said device areas.

6. The method of claim 5, wherein said conductive dopant is N type having a final concentration of between about 1.0 E 18 and 1.0 E 20 atoms/cm$^3$ in said source areas and said drain area.

7. The method of claim 1, wherein said gate oxide is silicon oxide formed by thermal oxidation to a thickness of about 20 to 1000 Angstroms.

8. The method of claim 1, wherein said control gate is formed from a polysilicon layer that has a thickness of between about 300 and 5000 Angstroms and is doped to a concentration of between about 1.0 E 19 and 1.0 E 21 atoms/cm$^3$.

9. The method of claim 1, wherein said interlevel dielectric layer is borophosphosilicate glass and is deposited by low-pressure chemical vapor deposition to a thickness of between about 2000 to 8000 Angstroms.

10. The method of claim 1, wherein said contact opening is etched using high-density plasma etching and an etchant gas that contains fluorine.

11. A method of fabricating an array of non-volatile memory cells for EEPROM circuits comprising the steps of:

providing a substrate having an array of device areas;

forming a tunnel oxide layer on said array of device areas;

forming a first and second floating gate in each device area of said array of device areas;

forming source areas in said substrate adjacent to outer edge of said floating gates and forming a drain area adjacent to and between said first and second floating gates;

forming a gate oxide layer on said floating gates;

forming a control gate over said drain area, and partially extending over said first and second floating gates, said control gate patterned with recesses to expose underlying portions of said drain area for a bit line contact;

forming an interlevel dielectric layer on said substrate;

etching a contact opening in said interlevel dielectric layer to said drain area for said bit line contact in each said device area in said array of device areas.

12. The method of claim 11, wherein said tunnel oxide is silicon oxide and is formed by thermal oxidation.

13. The method of claim 11, wherein said tunnel oxide is formed to a thickness of about 40 to 250 Angstroms.

14. The method of claim 11, wherein said first and second floating gates are formed from a polysilicon layer deposited to a thickness of about 300 to 3000 Angstroms and doped to a concentration of between about 1.0 E 19 and 1.0 E 21 atoms/cm$^3$.

15. The method of claim 11, wherein said source areas and said drain area are formed by ion implanting a conductive dopant in said device areas.

16. The method of claim 15, wherein said conductive dopant is N type having a final concentration of between about 1.0 E 18 and 1.0 E 20 atoms/cm$^3$ in said source areas and said drain area.

17. The method of claim 11, wherein said gate oxide is silicon oxide formed by thermal oxidation to a thickness of about 20 to 1000 Angstroms.

18. The method of claim 11, wherein said control gate is formed from a polysilicon layer that has a thickness of between about 300 and 5000 Angstroms and is doped to a concentration of between about 1.0 E 19 and 1.0 E 21 atoms/cm$^3$.

19. The method of claim 11, wherein said interlevel dielectric layer is borophosphosilicate glass and is deposited by low-pressure chemical vapor deposition to a thickness of between about 2000 to 8000 Angstroms.

20. The method of claim 11, wherein said contact opening is etched using high-density plasma etching and an etchant gas that contains fluorine.

21. An array of non-volatile memory cells for EEPROM circuits comprised of:
   a substrate having an array of device areas;
   a tunnel oxide layer on said array of device areas;
   a first and second floating gate in each device area of said array of device areas;
   source areas in said substrate adjacent to outer edge of said floating gates and a drain area adjacent to and between said first and second floating gates;
   a gate oxide layer on said floating gates;
   a control gate over said drain area partially extending over said first and second floating gates, said control gate patterned with recesses to expose underlying portions of said drain area for a bit line contact;
   an interlevel dielectric layer on said substrate;
   a contact opening in said interlevel dielectric layer to said drain area for said bit line contact in each said device area in said array of device areas.

22. The structure of claim 21, wherein said tunnel oxide is silicon oxide and has a thickness of about 40 to 250 Angstroms.

23. The structure of claim 21, wherein said first and second floating gates are formed from a polysilicon layer doped to a concentration of between about 1.0 E 19 and 1.0 E 21 atoms/cm$^3$.

24. The structure of claim 21, wherein said gate oxide is silicon oxide and has a thickness of about 20 to 1000 Angstroms.

25. The structure of claim 21, wherein said control gate is polysilicon that has a thickness of between about 300 and 5000 Angstroms and is doped to a concentration of between about 1.0 E 19 and 1.0 E 21 atoms/cm$^3$.

* * * * *